US006538211B2

(12) United States Patent  
St. Lawrence et al.

(10) Patent No.: US 6,538,211 B2
(45) Date of Patent: Mar. 25, 2003

(54) MULTI-LAYER CIRCUITS AND METHODS OF MANUFACTURE THEREOF

(75) Inventors: Michael E. St. Lawrence, Thompson, CT (US); Scott D. Kennedy, Canterbury, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 10/020,590

(22) Filed: Dec. 13, 2001

(65) Prior Publication Data

US 2002/0074158 A1 Jun. 20, 2002

Related U.S. Application Data

(60) Provisional application No. 60/255,595, filed on Dec. 14, 2000.

(51) Int. Cl.⁷ .................................................. H05K 1/02
(52) U.S. Cl. ........................................ 174/258; 174/265
(58) Field of Search ................................. 174/258, 257, 174/255, 256; 156/307.1; 361/784, 792

(56) References Cited

U.S. PATENT DOCUMENTS

| 3,625,844 A | 12/1971 | McKean ................... 204/140 |
| 3,677,828 A | 7/1972 | Caule .................... 148/6.15 R |
| 3,716,427 A | 2/1973 | Caule ......................... 156/3 |
| 3,764,400 A | 10/1973 | Caule ...................... 148/6.16 |
| 3,853,716 A | 12/1974 | Yates et al. ................. 204/28 |
| 4,387,006 A | 6/1983 | Kajiwara et al. ......... 204/32 R |
| 4,490,218 A | 12/1984 | Kadija et al. ................ 204/13 |
| 4,549,950 A | 10/1985 | Polan et al. ................ 204/206 |
| 4,568,431 A | 2/1986 | Polan et al. ................. 204/13 |
| 4,647,315 A | 3/1987 | Parthasarathi et al. ..... 148/6.16 |
| 4,692,221 A | 9/1987 | Parthasarathi ................ 204/13 |
| 4,737,398 A | 4/1988 | Ikenaga et al. ............. 428/216 |
| 4,863,767 A | 9/1989 | Garg et al. ..................... 428/1 |
| 4,876,120 A | 10/1989 | Belke et al. ................... 428/1 |
| 4,942,095 A | 7/1990 | Buchert et al. ............. 428/461 |

(List continued on next page.)

FOREIGN PATENT DOCUMENTS

| CA | 2273542 | 6/1998 |
| CA | 2273542 | 12/1999 |
| EP | 0 507 332 A2 | 4/1992 |
| EP | 0484818 A2 | 5/1992 |
| EP | 0507332 A2 | 10/1992 |
| EP | 0697278 B1 | 2/1996 |
| EP | 0 949 067 A2 | 4/1999 |
| EP | 0949067 A2 | 10/1999 |
| EP | 1 044 800 A1 | 3/2000 |
| EP | 1044800 A1 | 10/2000 |
| JP | 01319640 | 12/1989 |
| JP | 4367763 | 12/1992 |
| JP | 06097614 | 4/1994 |
| JP | 065097614 | 4/1994 |
| JP | Hei 7-3033 | 1/1995 |
| JP | 10324936 | 12/1998 |
| JP | 00280341 A | 10/2000 |
| JP | P2000-280341 A | 10/2000 |
| JP | P2001-244630 A | 7/2001 |
| WO | WO 97/19127 | 5/1997 |

*Primary Examiner*—Albert W. Paladini
(74) *Attorney, Agent, or Firm*—Cantor Colburn LLP

(57) ABSTRACT

A multi-layer circuit comprises a circuit and a resin covered conductive layer disposed on the circuit, wherein the resin covered conductive layer comprises a liquid crystalline polymer resin laminated to a conductive layer. Such multi-layer circuits are particularly useful for high density circuit applications.

25 Claims, 3 Drawing Sheets

U.S. PATENT DOCUMENTS

| | | | |
|---|---|---|---|
| 4,963,428 A | 10/1990 | Harvey et al. | 428/220 |
| 4,966,806 A | 10/1990 | Lusignea et al. | 428/220 |
| 4,966,807 A | 10/1990 | Harvey et al. | 428/220 |
| 4,975,312 A | 12/1990 | Lusignea et al. | 428/209 |
| 5,164,458 A | 11/1992 | Jennings et al. | 525/389 |
| 5,200,026 A * | 4/1993 | Okabe | 216/105 |
| 5,250,363 A | 10/1993 | Chen | 428/607 |
| 5,259,110 A | 11/1993 | Bross et al. | 29/830 |
| 5,288,529 A | 2/1994 | Harvey et al. | 428/1 |
| 5,360,672 A | 11/1994 | Saito et al. | 428/480 |
| 5,454,926 A | 10/1995 | Clouser et al. | 205/50 |
| 5,529,740 A | 6/1996 | Jester et al. | 264/317 |
| 5,544,773 A | 8/1996 | Haruta et al. | 216/13 |
| 5,571,608 A * | 11/1996 | Swamy | 174/255 |
| 5,614,324 A * | 3/1997 | Poutasse et al. | 428/447 |
| 5,703,202 A | 12/1997 | Jester et al. | 524/481 |
| 5,703,302 A | 12/1997 | Jester et al. | 528/481 |
| 5,719,354 A | 2/1998 | Jester et al. | 174/255 |
| 5,785,789 A * | 7/1998 | Gagnon et al. | 156/307.1 |
| 5,863,405 A | 1/1999 | Miyashita | 205/125 |
| 5,863,410 A | 1/1999 | Yates et al. | 205/585 |
| 5,863,666 A | 1/1999 | Merchant et al. | 428/544 |
| 5,900,292 A | 5/1999 | Moriya | 428/1 |
| 5,908,544 A | 6/1999 | Lee et al. | 205/316 |
| 5,997,765 A | 12/1999 | Furuta et al. | 252/299.01 |
| 6,027,771 A | 2/2000 | Moriya | 428/1 |
| 6,093,499 A | 7/2000 | Tomioka | 428/606 |
| 6,228,465 B1 * | 5/2001 | Takiguchi et al. | 174/258 |
| 6,274,242 B1 | 8/2001 | Onodera et al. | 428/411.1 |
| 6,296,949 B1 | 10/2001 | Bergstresser et al. | 428/626 |
| 6,403,211 B1 | 6/2002 | Yang et al. | 428/308.4 |
| 2001/0005545 A1 | 6/2001 | Andou et al. | 428/209 |
| 2002/0028293 A1 | 3/2002 | Yang et al. | 427/304 |
| 2002/0037397 A1 | 3/2002 | Suzuki et al. | 428/209 |

* cited by examiner

MULTI-LAYER CIRCUITS AND METHODS OF MANUFACTURE THEREOF

CROSS REFERENCE TO REALTED APPLICATIONS

This application claims the benefits of U.S. Provisional Patent Application Ser. No. 60/255,595 filed Dec. 14, 2000, which is fully incorporated herein by reference.

BACKGROUND OF THE INVENTION

This disclosure relates to multi-layer circuits. In particular, it relates to methods of making multi-layer circuits using a resin covered conductive layer comprising liquid crystalline polymer.

Circuits typically comprise a conductive circuit layer bonded or laminated to a dielectric layer. The conductive circuit layer is generally a conductive metal such as copper, and the dielectric layer generally comprises a polymer resin such as epoxy or polybutadiene. Depending on the selection of dielectric layer and its thickness, circuits can be either stiff or flexible.

Multi-layer circuits generally comprise at least one conductive circuit layer bonded to either another circuit or to a resin covered conductive layer, often referred to as a "cap layer". More complex configurations are also possible, having two or more circuits and one or more resin covered conductive layers. While suitable for their intended purposes, the requirements for multi-layer circuits and high density, high performance applications are becoming ever more demanding with respect to density and environmental and electrical performance. Accordingly, there remains a need in the art for a multi-layer circuit comprising a resin covered conductive layer that can meet these needs.

SUMMARY OF THE INVENTION

An improved multi-layer circuit comprises a circuit and a resin covered conductive layer disposed on the circuit, wherein the resin comprises a liquid crystalline polymer resin laminated to the conductive layer. Use of such resin covered conductive layers results in multi-layer circuits having a combination of mechanical, electrical, and thermal properties better than those currently available.

The above discussed and other features and advantages of the present invention will be appreciated and understood by those skilled in the art from the following detailed description and drawings.

BRIEF DESCRIPTION OF THE DRAWINGS

Referring now to the exemplary drawings, wherein like elements are numbered alike.

DETAILED DESCRIPTION OF THE PREFERRED EMBODIMENTS

Figure 1:
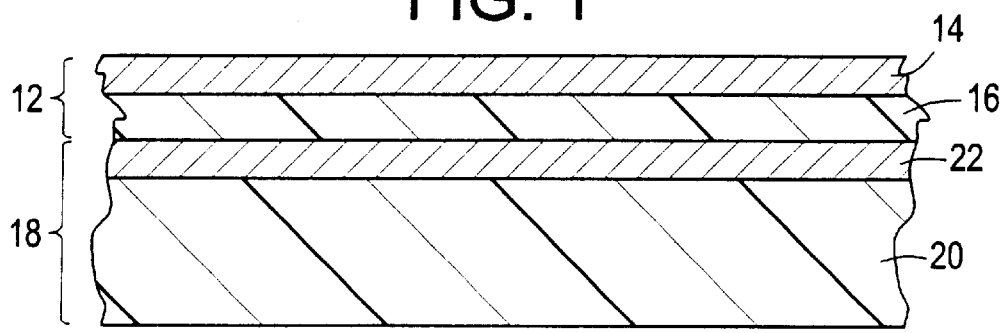
FIG. 1 is a schematic representation of a resin covered conductive layer disposed on a circuit.

A multi-layer circuit comprises a resin covered conductive layer disposed on a circuit. The resin covered conductive layer comprises at least one liquid crystalline polymer resin layer laminated to the conductive layer. The liquid crystalline polymer resin layer has an X-Y coefficient of thermal expansion (CTE) that is substantially the same as the X-Y CTE of the conductive layer. Substantially the same is herein defined as varying by less than about 20%, preferably by less than about 15%. Because the liquid crystalline polymer resin can be laminated directly to the conductive layer without an adhesive, the resulting multi-layer circuit exhibits higher performance with better mechanical, electrical and thermal properties than currently available materials.

Liquid crystalline polymers are known polymers, and are sometimes described as "rigid-rod", "rod-like", or ordered polymers. These polymers are believed to have a fixed molecular shape, e.g. linear, or the like, due to the nature of the repeating units comprising the polymeric chain. The repeating units typically comprise rigid molecular elements. The rigid molecular elements (mesogens) are frequently rod-like or disk-like in shape and are typically aromatic and frequently heterocyclic. The rigid molecular elements may be present in either the main chain (backbone) of the polymer or in the side chains. When present in the main chain or in the side chains they may be separated by more flexible molecular elements, sometimes referred to as spacers.

Liquid crystalline polymers can be blended with polymers that are not liquid crystalline polymers, hereinafter referred to as non-liquid crystalline polymers. These blends are sometimes referred to as polymer alloys. Some of these blends have processing and functional characteristics similar to liquid crystalline polymers and are thus included within the scope of the present invention. The non-liquid crystalline polymers and liquid crystalline polymer components are generally mixed in a weight ratio of 10:90 to 90:10, preferably in the range of 30:70 to 70:30. Hereinafter the term liquid crystalline polymer will include liquid crystal polymer blends.

Both thermotropic and lyotropic liquid crystalline polymers are useful. Furthermore, useful liquid crystalline polymers can be thermoplastic or thermosetting. Suitable thermotropic liquid crystalline polymers include liquid crystal polyesters, liquid crystal polycarbonates, liquid crystal polyetheretherketone, liquid crystal polyetherketoneketone and liquid crystal polyester imides, specific examples of which include (wholly) aromatic polyesters, polyester amides, polyamide imides, polyester carbonates, and polyazomethines.

Useful thermotropic liquid crystalline polymers also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymer include:

(a) at least one aromatic dicarboxylic acid compound,
(b) at least one aromatic hydroxy carboxylic acid compound,
(c) at least one aromatic diol compound,
(d) at least one of an aromatic dithiol ($d_1$), an aromatic thiophenol ($d_2$), and an aromatic thiol carboxylic acid compound ($d_3$), and
(e) at least one of an aromatic hydroxyamine compound and an aromatic diamine compound.

They may sometimes be used alone, but may frequently be used in a combination of monomers (a) and (c); (a) and (d); (a), (b) and (c); (a), (b) and (e); (a), (b), (c) and (e); or the like.

Examples of the aromatic dicarboxylic acid compound (a) include aromatic dicarboxylic acids such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl)propane, and bis(4-hydroxyphenyl)methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1,4-dithiol, benzene-1,3-dithiol, 2,6-naphthalene-dithiol, and 2,7-naphthalene-dithiol.

Examples of the aromatic thiophenol ($d_2$) include 4-mercaptophenol, 3-mercaptophenol, and 6-mercaptophenol.

Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Thermotropic liquid crystalline polymers are prepared from monomer(s) as mentioned above by a variety of esterification methods such as melt acidolysis or slurry polymerization, or the like methods.

The molecular weight of the thermotropic liquid crystalline polyester that may favorably be used may be about 2,000 to 200,000, preferably 4,000 to 100,000. The measurement of the molecular weight may be done, for example, either through determination of the terminal groups of a compressed film thereof according to infrared spectroscopy, or by gel permeation chromatography (GPC).

Thermotropic liquid crystalline polymers may be used either alone or in mixture of at least two thereof. A preferred thermotropic liquid crystalline polymer is 2-naphthalene carboxylic acid, 6-(acetyloxy)-polymer with 4-(acetyloxy) benzoic acid.

Suitable lyotropic liquid crystalline polymers include concentrated sulfuric acid solutions of poly(p-phenylene terephthalamide) (PPTA), silk fibroin aqueous solutions, and sericin aqueous solutions. A PPTA liquid crystalline polymer is represented by Formula I:

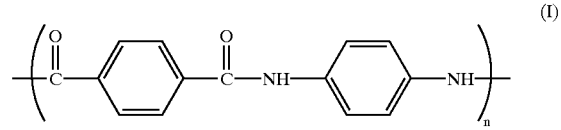

(I)

Preferred liquid crystalline polymers include, but are not limited to, aromatic polyester liquid crystalline polymer resins such as VECTRA®, commercially available from Ticona, XYDAR®, commercially available from Amoco Polymers, and ZENITE®, commercially available from DuPont, among others. An especially preferred liquid crystalline polymer film is based on a copolymer of hydroxy benzoate/hydroxy napthoate, known commercially as VECSTAR, available from Kuraray Co., Ltd., Japan. The liquid crystalline polymers and polymer blends described hereinabove are meant for illustration and not for limitation, as many other suitable liquid crystalline polymers and polymer blends are known in the art. Likewise, it is recognized that compatibilizers, plasticizers, flame retardant agents, and other additives may be contained in the liquid crystalline polymers.

Liquid crystalline polymers are useful in sheet or film form. Useful thicknesses are about 25 to about 150 micrometers, preferably about 50 to about 100 micrometers.

Exemplary conductive layers include metals such as copper, aluminum iron, nickel, stainless steel, silver, zinc, manganese, and alloys and mixtures comprising at least one of the foregoing metals. The conductive layer, e.g. copper, is typically in the form of a foil having a thickness of about 9 micrometers to about 70 micrometers, with about 9 micrometers to about 36 micrometers being preferred. Preferred copper foils are electrodeposited copper foils, especially those that comprise 0% to about 4% chromium and about 0% to about 1% zinc on their surface. Preferably the copper foils further comprise a dendritic layer.

The liquid crystalline polymer and conductive layer may be combined to form a resin covered conductive layer by either a batch wise lamination process or by a continuous lamination process. When the resin covered conductive layer is made by a continuous lamination process, the resin layer is placed next adjacent the conductive layer to form a stack. When the resin covered conductive layer comprises more than one resin layer the layers are assembled in the desired order to form a stack. The stack is then fed through a nip at a temperature and pressure effective to adhere the layers together. Useful nip temperatures are in the range of about 240° C. to about 350° C. with nip forces in the range from about 50 to about 350 pounds per linear inch (pli) (87.7 to 613.8 Newtons/centimeter (N/cm)). Temperature and pressure depend upon the choice of liquid crystalline polymer. The resulting resin covered conductive layer is then cooled and may be stored until used. When the resin covered conductive layer comprises more than one resin layer, the layers may be laminated together sequentially.

When the resin covered conductive layer is made by a batch wise or semi-continuous process, the resin layer is placed adjacent to the conductive layer to form a stack. When the resin covered conductive layer comprises more than one resin layer the layers are assembled in the desired order to form a stack. The stack is then placed in a press, which may or may not be evacuated to form a vacuum. The temperature is typically increased at a rate of about 4 to about 15° C./minute. Once the temperature reaches about 180° C. the pressure is increased from 0 to about 0.6 MegaPascal (MPa). The pressure is usually maintained at 0.6 MPa until the temperature reaches the desired temperature. The desired temperature depends upon the composition of the liquid crystalline polymer resin, and for most thermotropic liquid crystalline polymers is typically in the range of about 240° C. to about 350° C. At the desired temperature the pressure is increased to a pressure of about 2.4 to about 3.1 MPa. The stack is held at the desired temperature and pressure for about 5 to about 15 minutes. The resulting resin covered conductive layer is then cooled while maintaining the desired pressure. The resin covered conductive layer may be removed from the press when the temperature is 100° C. or lower, and stored until used.

Useful circuits for formation of the multi-layer circuits typically comprise at least one conductive circuit layer, and at least one dielectric layer. Useful conductive circuit layers include, but are not limited to, those described above in conjunction with the resin covered conductive layer. Useful dielectric layers include those known in the art that do not degrade during formation of the multi-layer circuit by the method disclosed herein. In embodiments wherein the resin covered conductive layer is in contact with the dielectric layer, useful dielectric layers include those known in the art that are compatible with at least one resin layer of the resin-covered conductive layer. Examples of such materials include, but are not limited to, epoxy, polyphenylene ether, polybutadiene, liquid crystalline polymers and polytetrafluoroethylene. It is also within the scope of the invention for the multi-layer circuit to comprise a plurality of circuit layers, generally in a stack either already laminated together or ready to be laminated together.

The multi-layer circuit may be made by either a batch wise lamination process or by a continuous lamination process although it is preferable for the multi-layer circuit to be made batchwise. In a batch wise or semi-continuous process, the resin covered conductive layer is placed adjacent a circuit to form a stack. Conditions for lamination depend on the identities and thicknesses of the resin covered conductive and the circuit(s). The stack is then placed in a press. The press may or may not be evacuated to form a vacuum. In a typical lamination process, the temperature is increased at a rate of about 4 to about 15° C./minute. If the press is evacuated then when the temperature reaches about 180° C. the pressure is increased from 0 psi to about 0.6 MPa. Alternately, if the press is not evacuated then the pressure is maintained at about 0.5 to about 1.0 MPa until the desired temperature is reached. The pressure is preferably maintained at 0.6 MPa until the temperature reaches the desired temperature. The desired temperature depends upon the composition of the liquid crystalline polymer resin. Temperatures are typically in the range of about 250° C. to about 350° C. At the desired temperature the pressure is increased to about 2.4 to about 7.6 MPa. The stack is held at the desired temperature and pressure for about 5 to about 30 minutes. The resulting multi-layer circuit is then cooled while maintaining the desired pressure. The multi-layer circuit may be removed from the press when the temperature is 100° C. or lower, and stored until used.

Referring now to FIG. 1, a resin covered conductive layer 12 comprises a conductive layer 14 and a liquid crystalline polymer resin layer 16 adhered, preferably laminated, thereto. Resin covered conductive layer 12 is disposed on a circuit 18 comprising a dielectric layer 20 and a conductive circuit layer 22.

Figure 2:
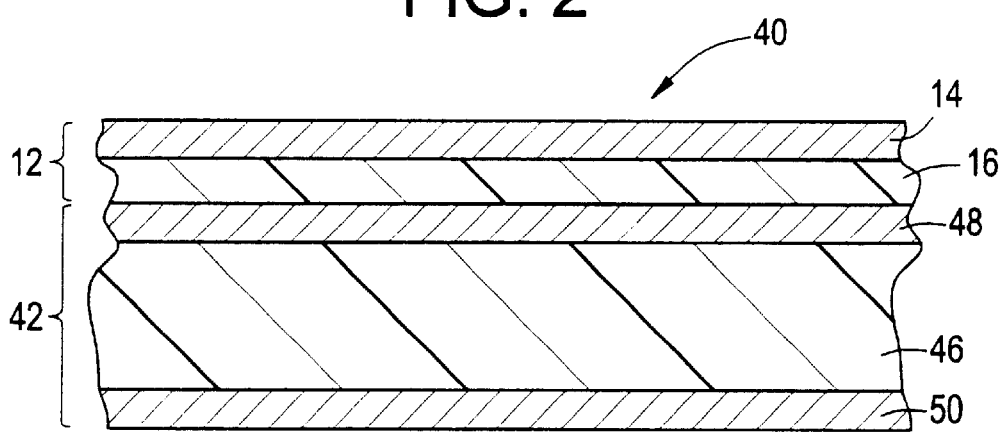
FIG. 2 is a schematic representation of a multi-layer circuit comprising a diclad circuit and a resin covered conductive layer.

FIG. 2 shows a multi-layer circuit 40 comprising a diclad circuit 42 and resin covered conductive layer 12. The diclad circuit 42 comprises a dielectric layer 46 with conductive layers 48, 50 disposed on each side. At least one of the conductive layers 48, 50 is a conductive circuit layer. The second conductive layer of diclad circuit 42 may be either a conductive circuit layer or a ground plane layer, for example. The resin covered conductive layer 12 comprises a liquid crystalline polymer layer 16 and a conductive layer 14 laminated thereto.

Figure 3:
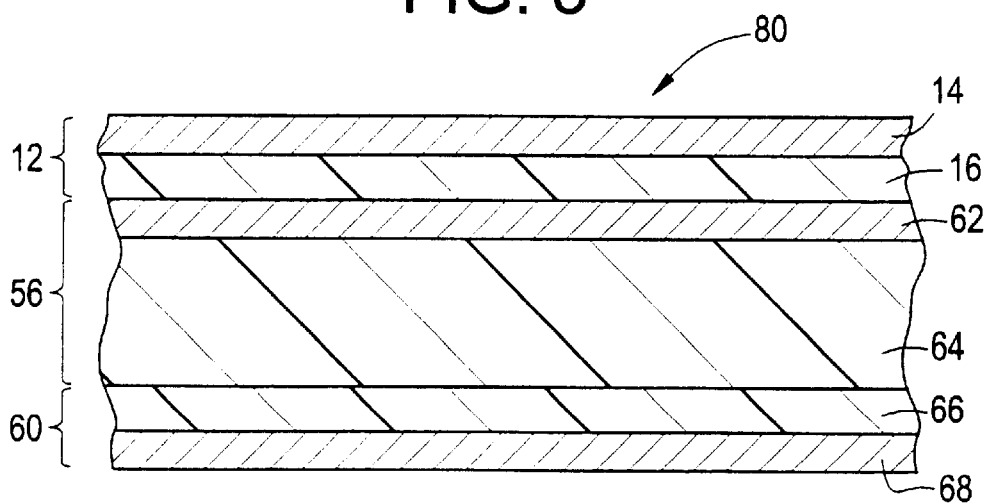
FIG. 3 is a schematic representation of a multi-layer circuit comprising a circuit and two resin covered conductive layers.

FIG. 3 shows an alternative configuration of a multi-layer circuit 80, comprising two resin covered conductive layers 12, 60. Circuit 56 comprises dielectric layer 64 adhered to conductive circuit layer 62. The side of dielectric layer 64 opposite conductive circuit layer 62 is adhered to resin covered conductive layer 60, which comprises a liquid crystalline polymer layer 66 laminated to a conductive layer 68. The side of conductive circuit layer 62 opposite dielectric layer 64 is adhered to the liquid crystalline polymer layer 16 of resin covered conductive layer 12, on a side apposite conductive layer 14.

Figure 4:
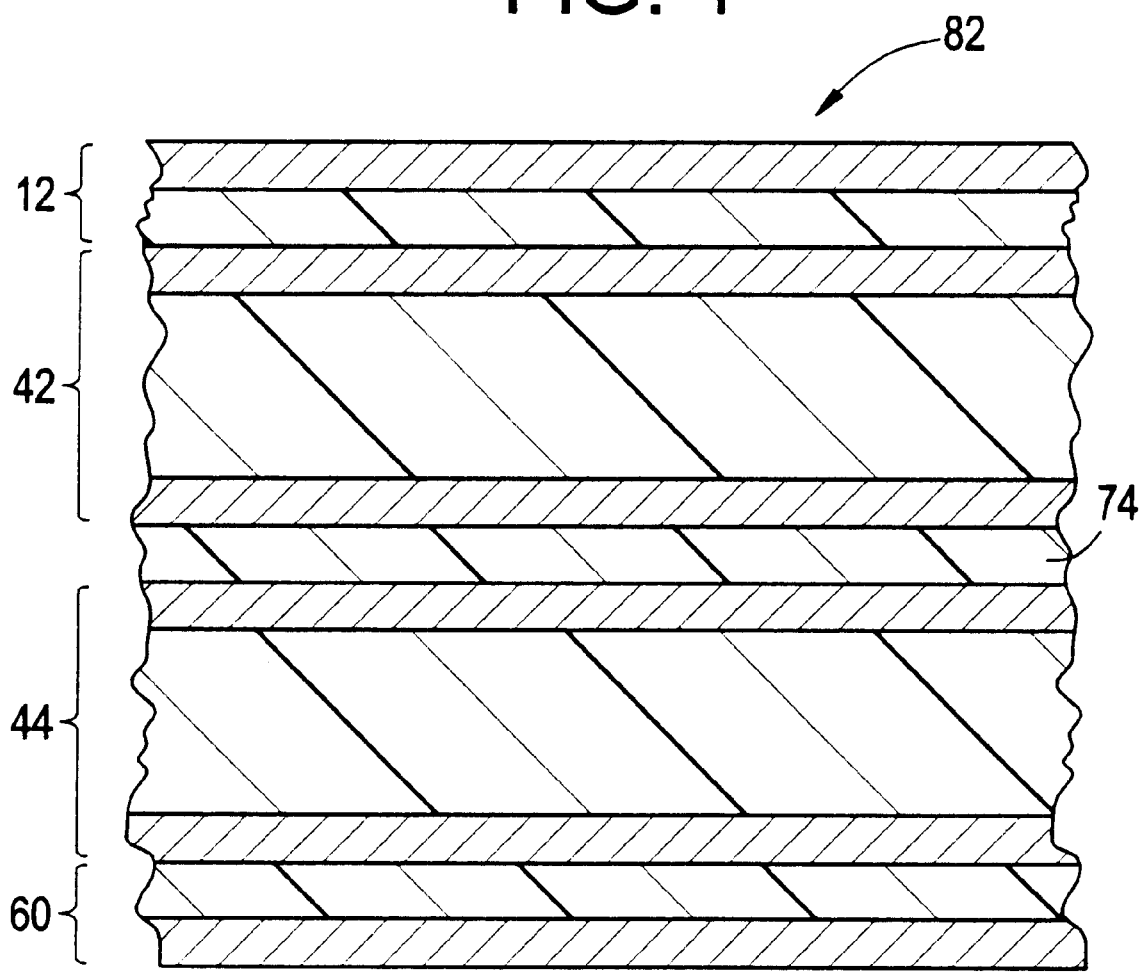
FIG. 4 is a schematic representation of a multi-layer circuit comprising two diclad circuits and two resin covered conductive layers.

FIG. 4 shows an alternative configuration of a multi-layer circuit 82 comprising two diclad circuits 42, 44 bonded to each other by an adhesive or bond ply 74. The diclad circuits 42, 44 are further adhered to resin covered conductive layers 12 and 60, respectively.

Figure 5:
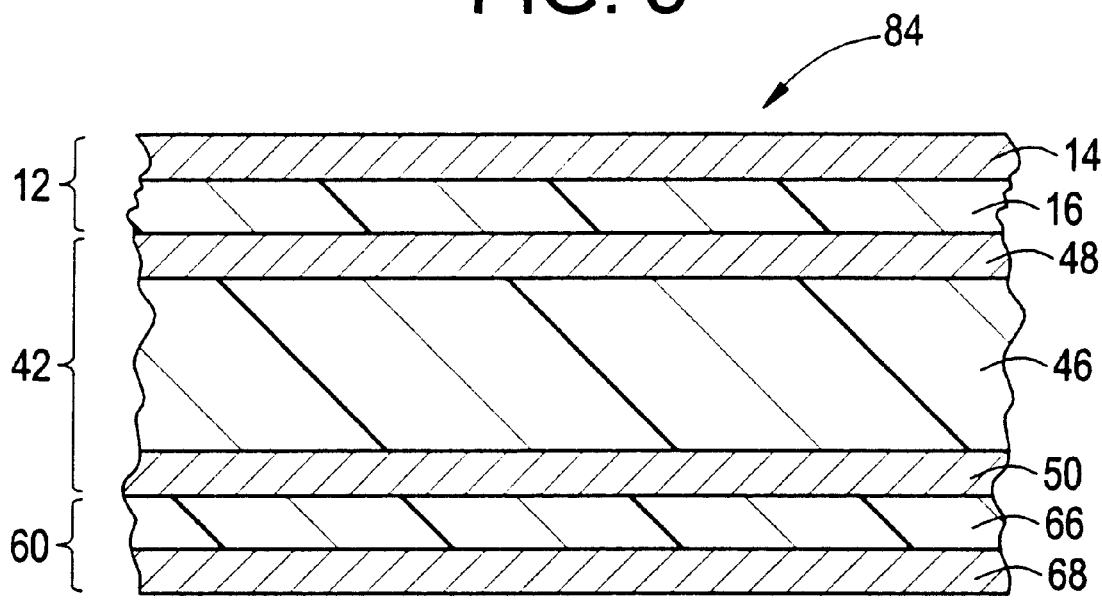
FIG. 5 is a schematic representation of a multi-layer circuit comprising a diclad circuit and two resin covered conductive layers.

FIG. 5 shows an alternative multi-layer circuit configuration 84 comprising a circuit layer 42 (consisting of dielectric layer 46 supporting conductive circuit layer 48, 50) disposed adjacent resin covered conductive layers 12 (comprising conductive layer 14 disposed on liquid crystalline polymer layer 16) on one side and disposed on adjacent covered conductive layer 60 (comprising conductive layer 68 and liquid crystalline polymer layer 66).

Figure 6:
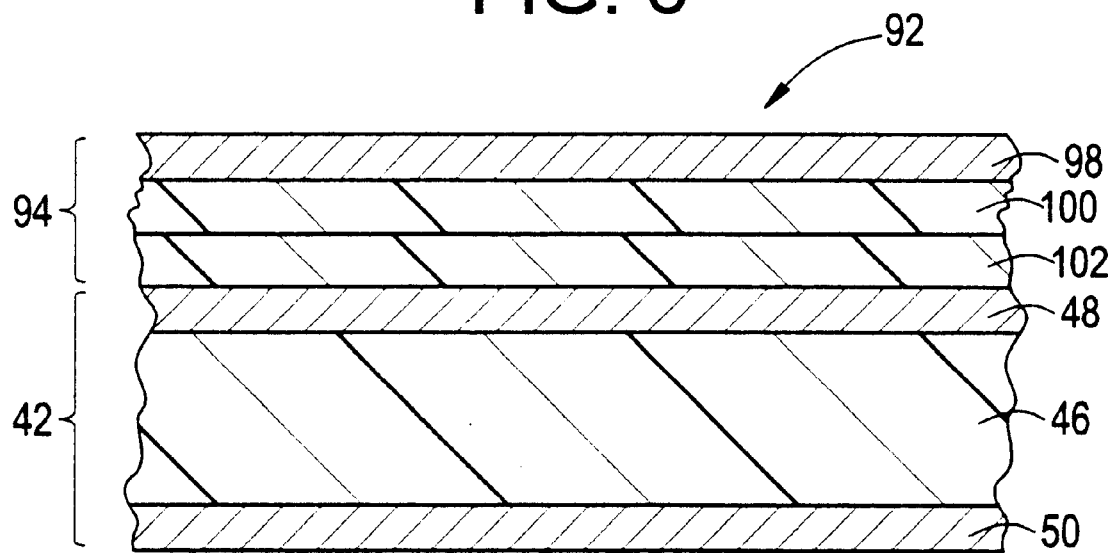
FIG. 6 is a schematic representation of a multi-layer circuit comprising a diclad circuit and a resin covered conductive layer comprising two liquid crystalline polymer layers.

FIG. 6 shows an alternative multi-layer circuit 92 comprising a resin covered conductive layer 94 adhered to a diclad circuit layer 42, which comprises a dielectric layer 46 disposed between conductive circuit layers 48, 50. The resin covered conductive layer 94 comprises a first liquid crystalline polymer layer 100 laminated to a conductive layer 98 and a second liquid crystalline polymer layer 102 disposed on first liquid crystalline polymer layer 100. The two (or more) liquid crystalline resin polymer layers may be the same or different. When the resin covered conductive layer comprises more than one layer of liquid crystalline polymer on the same side of the conductive layer, the layer 100 (the layer closest to the conductive layer) preferably has a higher melt temperature (if thermoplastic) than the outer resin layer 102. The first layer provides structural support and maintains a minimum distance from the circuit layer in the multi-layer circuit. Upon lamination to the conductive circuit layer of the circuit, the outer layer flows and fills the circuit features, as well as provides adhesion for the system.

The invention is further illustrated by the following non-limiting Examples.

EXAMPLE 1.

A liquid crystalline polymer film, VECSTAR™ FA-X-100 available from Kuraray, with a thickness of 0.002 inches, was placed on top of an electrodeposited copper foil, TAX-M, available from Yates, to form a stack. The stack was placed in a flat bed lamination press and heated at 292° C. and 425 psig (2.9 MegaPascals (Mpa)) for 15 minutes. The resulting resin covered conductive layer was then cooled while maintaining a pressure of 425 psig (2.9 MPa). The resin covered layer was then combined with a printed circuit with a test pattern to form a stack. The test pattern consisted of series of parallel circuit traces. The stack was placed in a flat bed press that was heated to 280° C. at 100 psig (0.7 MPa) at a rate of 2° C./min. The pressure was then increased to 400 psig (2.7 MPa). The temperature and pressure was maintained for 10 minutes and then the temperature was decreased at a rate of 4° C./min. The resulting multi-layer circuit showed complete resin fill. Minimal transfer of the circuit traces was observed yielding a flat multi-layer circuit in the x-y plane. Dielectric strength values between adjacent copper traces in the test pattern were found to average 760 volts/mil (299.2 kilovolts per centimeter).

EXAMPLE 2.

A resin covered conductive layer was prepared as described above and then used to make a multi-layer circuit using the same type of circuit layer as described above. The resin covered conductive layer was placed on top of the circuit to form a stack. The stack was placed in a flat bed press, which was heated to 270° C. at 100 psig (0.7 MPa) at a rate of 2° C./min. The pressure was then increased to 600 psig (4.1 MPa). The temperature and pressure was maintained for 10 minutes and then the temperature was decreased at a rate of 4° C./min. The resulting multi-layer circuit showed complete resin fill. Minimal image transfer was observed yielding a flat multi-layer circuit in the x-y plane. Dielectric strength values between adjacent copper lines in the test pattern were found to average 572 volts/mil (225.2 kilovolts per centimeter (KV/cm)).

As can be seen by the foregoing description and examples the use of a resin covered conductive layer comprising at least one liquid crystalline polymer layer and a conductive layer in a multi-layer circuit results in a multi-layer circuit with improved mechanical, thermal and electrical properties.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A multi-layer circuit comprising
   a first circuit comprising a first conductive circuit layer disposed on a dielectric layer; and
   a resin covered conductive layer disposed on the first circuit, wherein the resin covered conductive layer comprises a liquid crystalline polymer layer laminated to a conductive layer, and wherein the liquid crystalline polymer layer is disposed on a side of the first conductive circuit layer opposite to the dielectric layer.

2. The multi-layer circuit of claim 1, wherein the conductive layer is a metal selected from the group consisting of copper, aluminum iron, nickel, stainless steel, silver, zinc, manganese, and alloys and mixtures comprising at least one of the foregoing metals.

3. The multi-layer circuit of claim 2, wherein the conductive layer is copper.

4. The multi-layer circuit of claim 1, wherein the conductive layer has a thickness of about 9 micrometers to about 70 micrometers.

5. The multi-layer circuit of claim 4, wherein the conductive layer has a thickness of about 9 micrometers to about 36 micrometers.

6. The multi-layer circuit of claim 1, wherein the liquid crystalline polymer layer has a thickness of about 25 micrometers to about 150 micrometers.

7. The multi-layer circuit of claim 1, wherein the liquid crystalline polymer comprises a copolymer of hydroxy benzoate/hydroxy napthoate.

8. The multi-layer circuit of claim 1, wherein the liquid crystalline polymer layer has substantially the same X-Y coefficient of thermal expansion as the conductive layer.

9. The multi-layer circuit of claim 1, wherein the first circuit is a flexible circuit.

10. The multi-layer circuit of claim 1, wherein the first circuit further comprises a second conductive layer disposed on a side of the dielectric layer opposite to the first conductive circuit layer, wherein the second conductive layer may be etched to form a second conductive circuit layer.

11. The multi-layer circuit of claim 10, further comprising a second circuit adhered to the first circuit by an adhesive or bond ply.

12. The multi-layer circuit of claim 11, further comprising an additional resin covered conductive layer disposed on the second circuit, wherein the additional resin covered conductive layer comprises a second liquid crystalline polymer layer laminated to a third conductive layer.

13. The multi-layer circuit of claim 12, wherein the second liquid crystalline polymer layer is disposed on the second circuit.

14. The multi-layer circuit of claim 11, wherein the second circuit comprises a second dielectric layer disposed between a third conductive circuit layer and a third conductive layer, wherein the third conductive layer may comprise a fourth conductive circuit layer or a ground plane layer.

15. The multi-layer circuit of claim 14, further comprising an additional resin covered conductive layer disposed on the second circuit, wherein the additional resin covered conductive layer comprises a second liquid crystalline polymer layer laminated to a fourth conductive layer.

16. The multi-layer circuit of claim 15, wherein the second liquid crystalline polymer layer is disposed on the second circuit.

17. A multi-layer circuit comprising a first circuit having a first side and a second side, the first circuit comprising a first conductive circuit layer disposed on a dielectric layer, and a second conductive circuit layer or a ground plane layer disposed on a side of the dielectric layer opposite the first conductive circuit layer;

a first resin covered conductive layer disposed on the first side of the first circuit, wherein the first resin covered conductive layer comprises a first liquid crystalline polymer layer laminated to a first conductive layer, and wherein the first liquid crystalline polymer layer is disposed on a side of the first conductive circuit layer opposite to the dielectric layer; and a second resin covered conductive layer disposed on the second side of the first circuit, wherein the second resin covered conductive layer comprises a second liquid crystalline polymer layer laminated to a second conductive layer, and wherein the second liquid crystalline polymer layer is disposed on a side of the second conductive circuit layer or ground plane layer opposite to the dielectric layer.

18. A multi-layer circuit comprising a first circuit comprising a conductive circuit layer and a dielectric layer; and a resin covered conductive layer comprising:

a second liquid crystalline polymer layer disposed between a conductive layer and a first liquid crystalline polymer layer;

wherein the resin covered conductive layer is disposed on the first circuit.

19. The multi-layer circuit of claim 18, wherein the first circuit further comprises a second conductive circuit layer disposed on a side of the dielectric layer opposite to the conductive circuit layer.

20. The multi-layer circuit of claim 18, wherein the second liquid crystalline polymer layer has a melt temperature higher than the first crystalline polymer layer.

21. The multi-layer circuit of claim 18, wherein the first liquid crystalline polymer layer is adhered to the conductive circuit layer.

22. A multi-layer circuit comprising a first circuit comprising a first conductive circuit layer disposed on a dielectric layer; and a resin covered conductive layer disposed on the circuit, wherein the resin covered conductive layer comprises a first liquid crystalline polymer layer laminated to a conductive layer and the first liquid crystalline polymer layer is adhered to a side of the dielectric layer opposite to the first conductive circuit layer.

23. A multi-layer circuit comprising a first circuit comprising a conductive circuit layer disposed on a dielectric layer;

a first resin covered conductive layer comprising a first liquid crystalline polymer layer laminated to a first conductive layer; and a second resin covered conductive layer comprising a second liquid crystalline polymer layer laminated to a second conductive layer; wherein the first liquid crystalline polymer layer is disposed on a first side of the first circuit and the second liquid crystalline polymer layer is disposed on a second side of the first circuit.

24. The multi-layer circuit of claim 23, wherein the first liquid crystalline polymer layer and the second liquid crystalline polymer layer comprise different liquid crystalline polymers.

25. The mulit-layer circuit of claim 23, wherein the first liquid crystalline polymer layer and the second liquid crystalline polymer layer comprise the same liquid crystalline polymer.

* * * * *